(12) United States Patent
Tsai et al.

(10) Patent No.: US 9,041,204 B2
(45) Date of Patent: May 26, 2015

(54) BONDING PAD STRUCTURE WITH DENSE VIA ARRAY

(75) Inventors: Tsung-Han Tsai, Zhunan Township (TW); Jung-Chi Jeng, Tainan (TW); Yueh-Ching Chang, Kaohsiung (TW); Volume Chien, Sinying (TW); Huang-Ta Huang, Tainan (TW); Chi-Cherng Jeng, Madou Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 13/435,702

(22) Filed: Mar. 30, 2012

(65) Prior Publication Data

US 2013/0256893 A1    Oct. 3, 2013

(51) Int. Cl.
*H01L 23/522* (2006.01)
*H01L 23/528* (2006.01)
(Continued)

(52) U.S. Cl.
CPC .......... *H01L 23/5226* (2013.01); *H01L 23/481* (2013.01); *H01L 23/53223* (2013.01); *H01L 23/53238* (2013.01); *H01L 23/53252* (2013.01); *H01L 23/5329* (2013.01); *H01L 24/03* (2013.01); *H01L 24/05* (2013.01); *H01L 2224/0345* (2013.01); *H01L 2224/03452* (2013.01); *H01L 2224/03616* (2013.01); *H01L 2224/0401* (2013.01); *H01L 2224/04042* (2013.01); *H01L 2224/05009* (2013.01); *H01L 2224/05018* (2013.01); *H01L 2224/05019* (2013.01); *H01L 2224/0508* (2013.01); *H01L 2224/05083* (2013.01); *H01L 2224/05085*
(Continued)

(58) Field of Classification Search
CPC ................. H01L 21/76805; H01L 21/76807
USPC ............... 257/758, 773, 774, 786, E21.507, 257/E23.019, E23.02, E23.011, 762, 775
See application file for complete search history.

(56) References Cited

U.S. PATENT DOCUMENTS 6,444,295 B1 * 9/2002 Peng et al. ............... 428/209
6,455,943 B1 * 9/2002 Sheu et al. ............... 257/786
(Continued)

*Primary Examiner* — Fernando L Toledo
*Assistant Examiner* — Christine C Lau
(74) *Attorney, Agent, or Firm* — Lowe Hauptman & Ham, LLP

(57) ABSTRACT

A bonding pad structure includes a substrate and a first conductive island formed in a first dielectric layer and disposed over the substrate. A first via array having a plurality of vias is formed in a second dielectric layer and disposed over the first conductive island. A second conductive island is formed in a third dielectric layer and disposed over the first via array. A bonding pad is disposed over the second conductive island. The first conductive island, the first via array, and the second conductive island are electrically connected to the bonding pad. The first via array is connected to no other conductive island in the first dielectric layer except the first conductive island. No other conductive island in the third dielectric layer is connected to the first via array except the second conductive island.

20 Claims, 9 Drawing Sheets

(51) Int. Cl.
*H01L 23/532* (2006.01)
*H01L 23/48* (2006.01)
*H01L 23/00* (2006.01)

(52) U.S. Cl.
CPC ......... (2013.01); *H01L 2224/05086* (2013.01); *H01L 2224/05087* (2013.01); *H01L 2224/05088* (2013.01); *H01L 2224/05096* (2013.01); *H01L 2224/05098* (2013.01); *H01L 2224/05124* (2013.01); *H01L 2224/05144* (2013.01); *H01L 2224/05147* (2013.01); *H01L 2224/05166* (2013.01); *H01L 2224/05181* (2013.01); *H01L 2224/05184* (2013.01); *H01L 2224/05187* (2013.01); *H01L 2224/05624* (2013.01); *H01L 2924/00012* (2013.01); *H01L 2924/00014* (2013.01); *H01L 2924/01029* (2013.01); *H01L 2924/04941* (2013.01); *H01L 2924/04953* (2013.01)

(56) References Cited

U.S. PATENT DOCUMENTS

| | | | | |
|---|---|---|---|---|
| 6,897,570 | B2 * | 5/2005 | Nakajima et al. | 257/786 |
| 7,084,509 | B2 * | 8/2006 | Egitto et al. | 257/774 |
| 7,397,125 | B2 * | 7/2008 | Oda | 257/758 |
| 7,642,653 | B2 * | 1/2010 | Kuzuhara et al. | 257/758 |
| 8,310,056 | B2 * | 11/2012 | Oda et al. | 257/773 |
| 8,736,067 | B2 * | 5/2014 | Hirano et al. | 257/774 |
| 8,896,124 | B2 * | 11/2014 | Li et al. | 257/774 |
| 2002/0006717 | A1 * | 1/2002 | Yamaha | 438/612 |
| 2003/0020163 | A1 * | 1/2003 | Hung et al. | 257/734 |
| 2004/0150112 | A1 * | 8/2004 | Oda | 257/758 |
| 2005/0067707 | A1 * | 3/2005 | Hashimoto et al. | 257/758 |
| 2006/0289997 | A1 * | 12/2006 | Tomita | 257/758 |
| 2008/0105947 | A1 * | 5/2008 | Kuzuhara et al. | 257/506 |
| 2008/0246152 | A1 * | 10/2008 | Liu et al. | 257/758 |
| 2010/0263913 | A1 * | 10/2010 | Daubenspeck et al. | 174/250 |

* cited by examiner

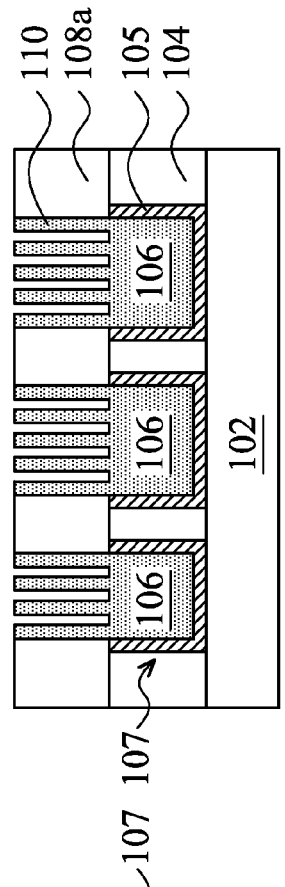
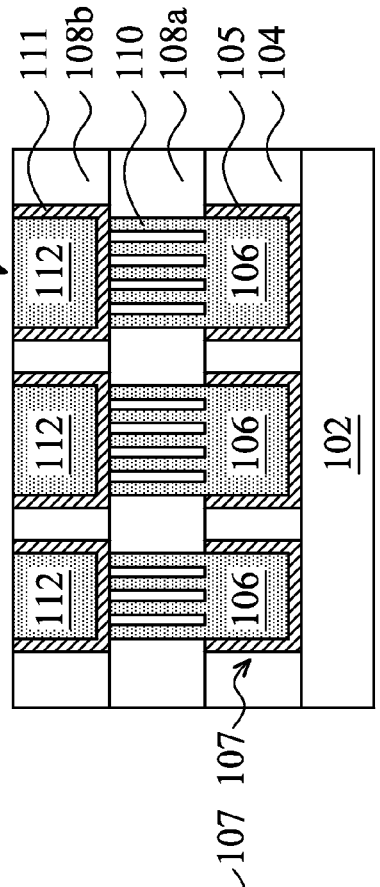
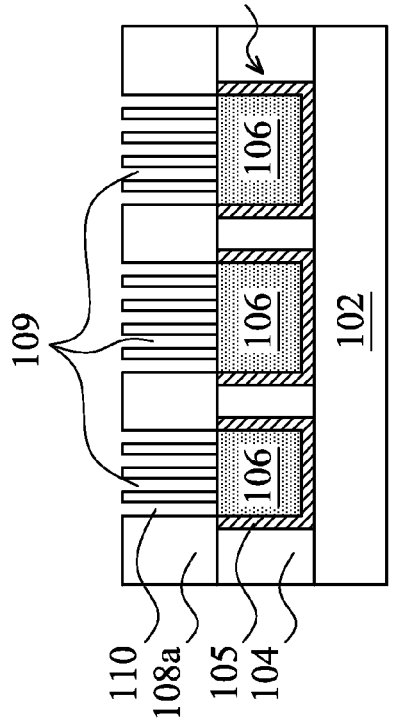
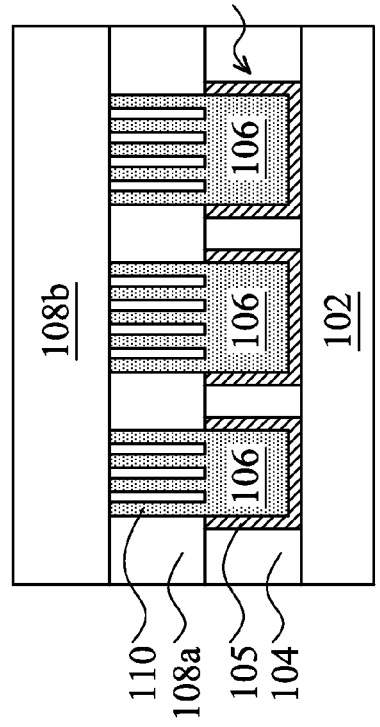

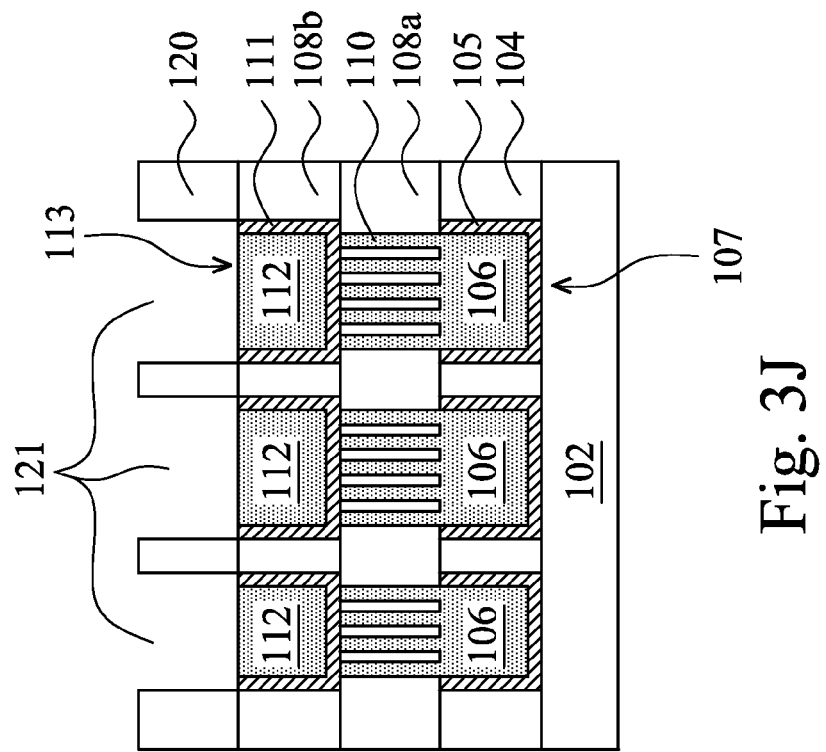
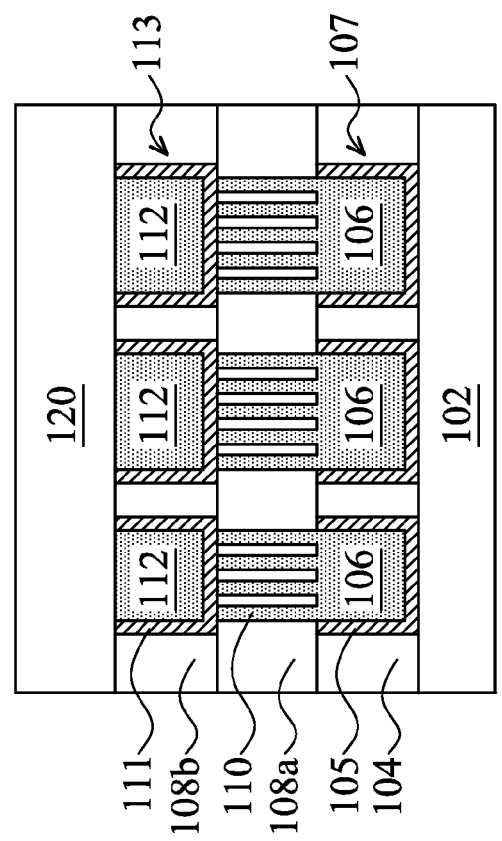
Fig. 3J
Fig. 3I

BONDING PAD STRUCTURE WITH DENSE VIA ARRAY

TECHNICAL FIELD

The present disclosure relates generally to an integrated circuit and more particularly a bonding pad with dense via array.

BACKGROUND

A bonding or bumping pad is used for electrical connections, such as wire bonding or flip-chip bumps, etc. In a slot structure with multiple vias/metal pads connected to the bonding pad, each via is connected to a respective metal pad (or metal island). The adhesion between via and metal pad is relatively weak resulting in peeling or cracking at an interface of the via and metal pad during a bonding or bumping process. With increasing bonding/bumping forces, a peeling rate at the via/metal pad interface also increases. Further, the via density is limited in the slot structure.

BRIEF DESCRIPTION OF THE DRAWINGS

Reference is now made to the following descriptions taken in conjunction with the accompanying drawings, in which:

FIGS. 3A-3K are schematic diagrams of intermediate fabrication steps of an exemplary bonding pad structure similar to FIG. 1A according to some embodiments;

DETAILED DESCRIPTION

Figure 1A:
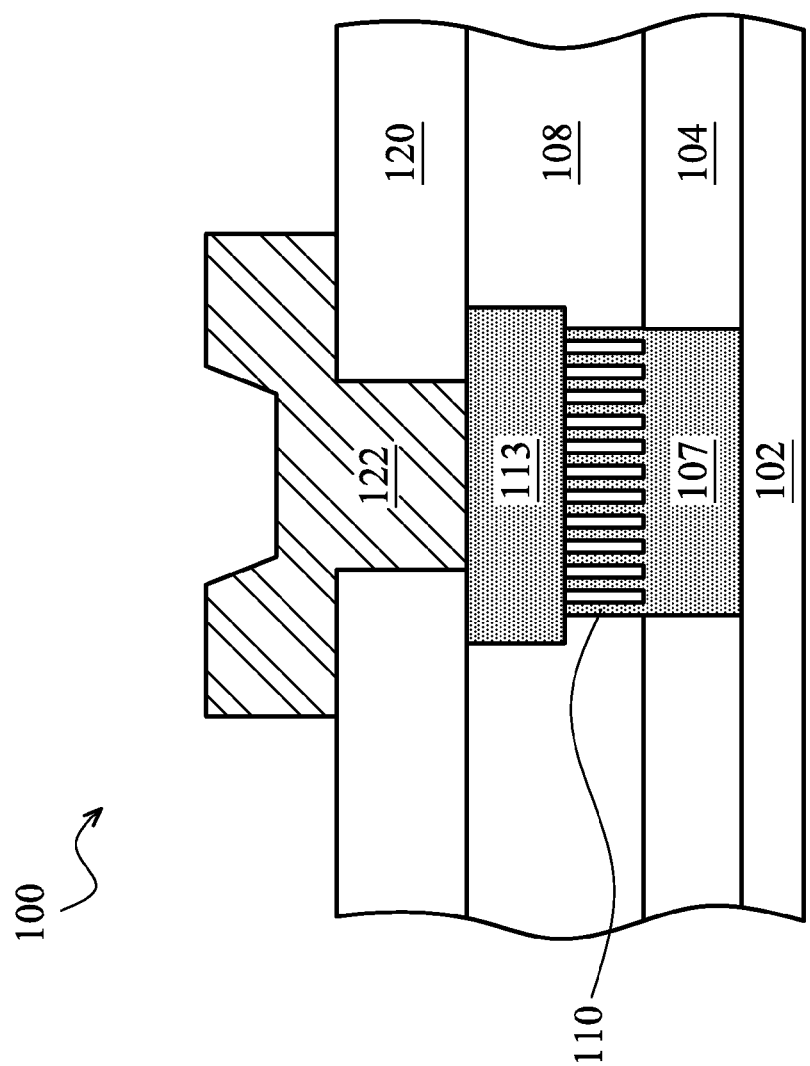
FIG. 1A is a schematic diagram of an exemplary bonding pad structure according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1A is a schematic diagram of an exemplary bonding pad structure 100 according to some embodiments. The bonding pad structure 100 includes a substrate 102, a first conductive island 107 formed in a dielectric layer 104 and disposed over the substrate 102. A first via array 110 with multiple vias is formed in another dielectric layer 108 and disposed over the first conductive island 107. A second conductive island 113 is formed in the dielectric layer 108 and disposed over the first via array 110. A bonding pad 122 (e.g., a conductive metal island) is formed through and over the passivation layer 120 and disposed over the second conductive island 113.

The first conductive island 107, the first via array 110, and the second conductive island 113 are electrically connected to the bonding pad 122. The dielectric layer 108 can comprise multiple dielectric layers, e.g., second and third dielectric layers 108a, 108b (as depicted in FIGS. 3D and 3G), each having a thickness corresponding to the first via array 110 and the second conductive island 113. A passivation layer 120 is formed over the dielectric layer 108 and the bonding pad 122 is connected to the second conductive island 113 through the passivation layer 120. The first via array 110 is connected to no other conductive island in the dielectric layer 104 except the first conductive island 107 and no other conductive island in the dielectric layer 108 is connected to the via array 110 except the second conductive island 113.

The substrate 102 comprises silicon, intermetal dielectric (IMD), low-k dielectric, or any other suitable material in some embodiments. The first conductive island 107 and the second conductive island 113 comprise conductive metal such as Cu, Cu alloy, W, Au, Al, or any other suitable material and barrier metal such as Ta, Ti, TaN, TiN, or any other suitable material in some embodiments. The barrier metal prevents the conductive metal diffusion into neighboring portions of the dielectric layer 104, 108 and/or the substrate 102.

The dielectric layers 104 and 108 comprise $SiO_2$, low-k dielectric, SiC, SiN, SiOC, TEOS, or any combination thereof in some embodiments. The first via array 110 comprises conductive metal such as Cu, W, or any other suitable material, and barrier metal such as TiN, TaN, or any other suitable material to prevent the conductive metal diffusion to neighboring dielectric layer and/or substrate. The passivation layer 120 comprises SiC, TEOS, hard black diamond (HBD), SiN, or any other suitable material in some embodiments.

Because the first conductive island 107 or the second conductive island 113 is not slotted (i.e., individually divided) but a single solid (i.e., continuous) part, the first via array 110 can be more densely populated. Thus, the via density is increased and the ratio of via area over the first or second conductive island 107, 113 area can range from 10% to 99% in some embodiments. From the increased via density, the adhesion between the first via array 110 and the first conductive island 107, the second conductive island 113, and the bonding pad 122 is stronger, thus reducing the peeling rate at the via interface.

Also, the contact resistance between the first via array 110 and the first conductive island 107, the second conductive island 113, and the bonding pad 122 is reduced. The vias in the first via array 110 are distributed in any form or shape and do not have to be uniformly distributed. The first via array 110 can be partially dense in a certain portion of the first conductive island 107 area, for example.

Figure 1B:
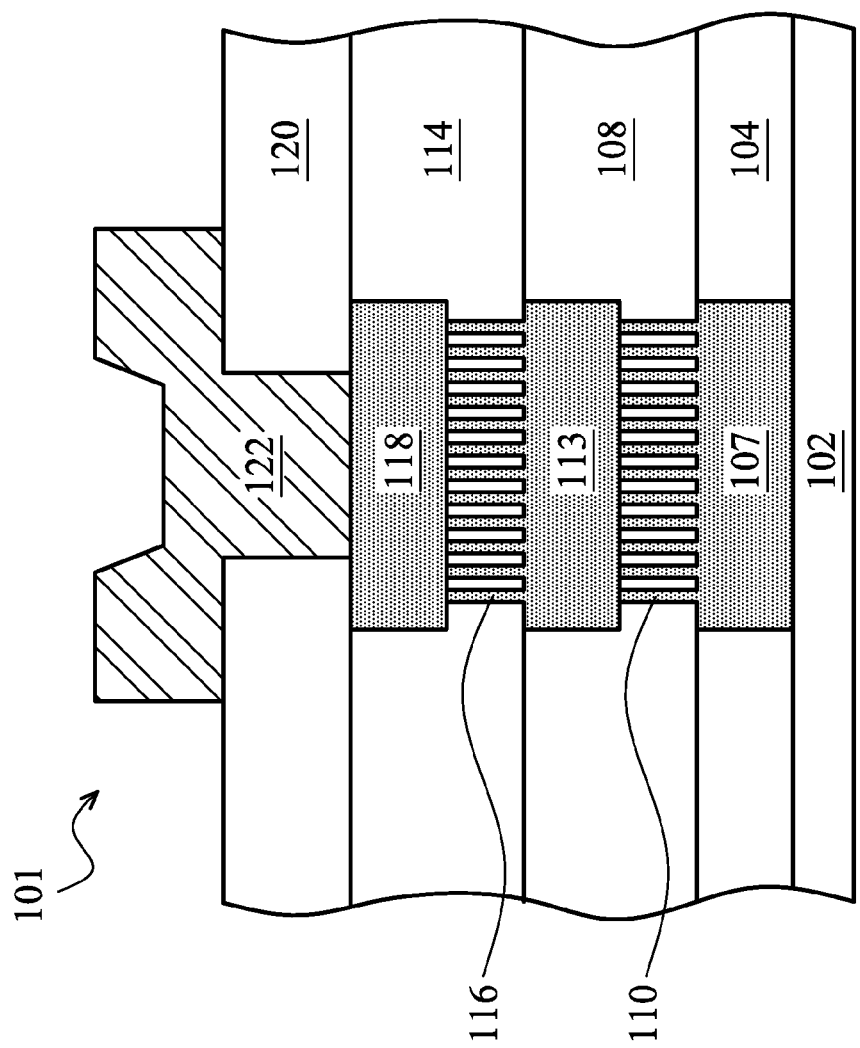
FIG. 1B is a schematic diagram of another exemplary bonding pad structure according to some embodiments.

FIG. 1B is a schematic diagram of another exemplary bonding pad structure 101 according to some embodiments. The bonding pad structure 101 is similar to the bonding pad structure 100 in FIG. 1A but adds another level including a second via array 116 formed in a dielectric layer 114 and a third conductive island 118. The second via array 116 is disposed over the second conductive island 113.

The dielectric layer 114 can comprise multiple dielectric layers, e.g., a fourth and a fifth dielectric layer, each having a thickness corresponding to the second via array 116 and the second conductive island 118. The bonding pad 122 is disposed over the third conductive island 118 and connected to the third conductive island 118 and the second via array 116, which is in turn connected to the second conductive island 113, the first via array 110, and the first conductive island 107. The second via array 116 is connected to no other conductive island in the dielectric layer 108 except the second conductive island 113 and no other conductive island in the dielectric layer 114 is connected to the second via array 116 except the third conductive island 118 in some embodiments.

The third conductive island 118 comprises conductive metal such as Cu, Cu alloy, W, Au, Al, or any other suitable material and barrier metal such as Ta, Ti, TaN, TiN, or any other suitable material in some embodiments. The barrier metal prevents the conductive metal diffusion into neighboring dielectric layer and/or substrate. The dielectric layer 114 comprises $SiO_2$, low-k dielectric, SiC, SiN, SiOC, TEOS, or any combination thereof in some embodiments. The second via array 116 comprises conductive metal such as Cu, W, or any other suitable material, and barrier metal such as TiN, TaN, or any other suitable material to prevent the conductive metal diffusion to neighboring portions of the dielectric layer 114 or the substrate 102.

Figure 2:
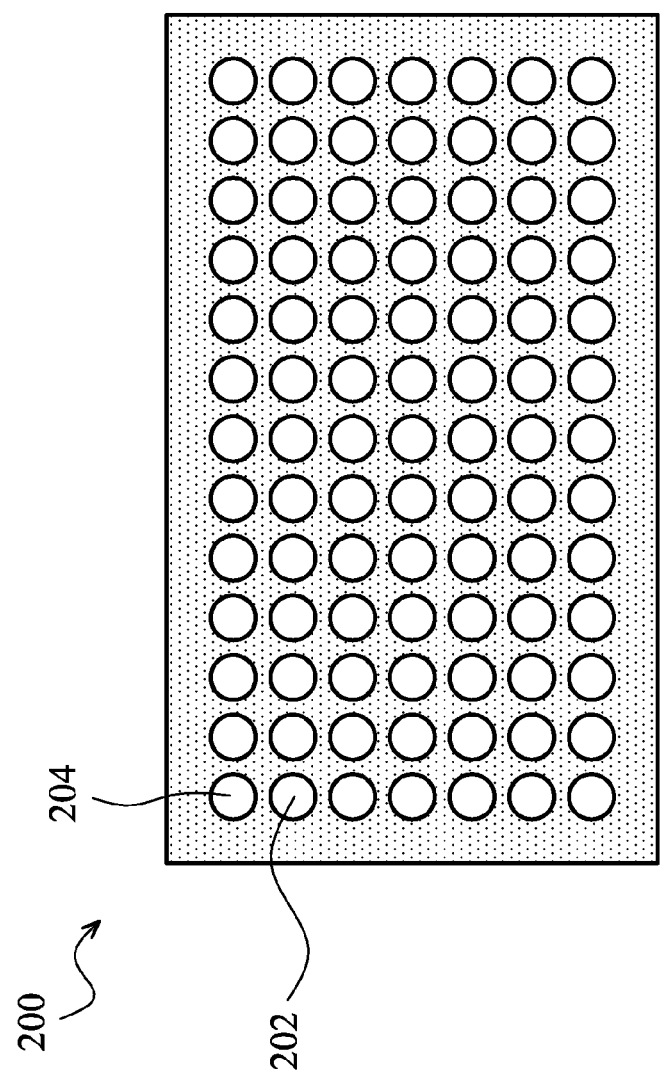
FIG. 2 is a top view of the exemplary dense via array in the bonding pad structures in FIGS. 1A and 1B according to some embodiments.

FIG. 2 is a top view of the exemplary dense via array in the bonding pad structures in FIGS. 1A and 1B according to some embodiments. A bonding pad structure 200 including a conductive island (e.g., metal pad) 202 is shown having a dense via array 204. The conductive island 202 is, for example, the first conductive island 107, the second conductive island 113 in FIG. 1A, or the third conductive island 118 in FIG. 1B. The dense via array 204 is, for example, the first via array 110 in FIG. 1A or the second via array 116 in FIG. 1B. The via array 204 can be distributed in any form or shape and don't have to be uniformly distributed as shown in FIG. 2. The via array 204 can be partially dense in a certain portion of the conductive island 202, for example.

Figure 3A:
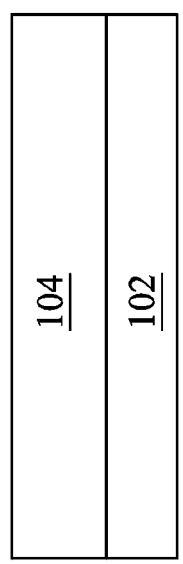
Figure 3B:
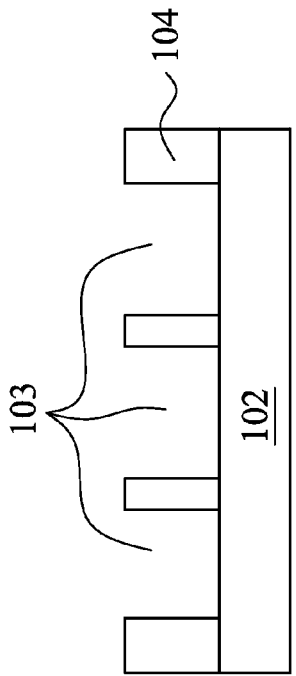
Figure 3C:
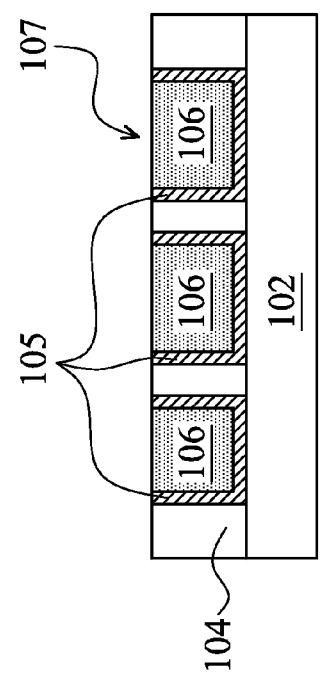
Figure 3D:
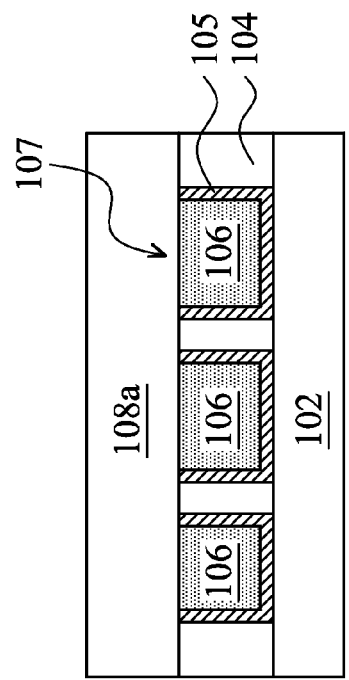

FIGS. 3A-3K are schematic diagrams of intermediate fabrication steps of an exemplary bonding pad structure similar to FIG. 1A according to some embodiments. In FIG. 3A, a dielectric layer 104 such as intermetal dielectric (IMD) is formed on a substrate 102 by chemical vapor deposition (CVD), for example. The dielectric layer 104 comprises $SiO_2$, low-k dielectric, SiC, TEOS, hard black diamond (HBD), SiOC, or any other suitable material with a thickness ranging from 500 Å to 5000 Å in some embodiments.

In FIG. 3B, trenches 103 for conductive islands (i.e., solid metal pads) are formed in the dielectric layer 104 by dry etching process, for example. A trench width (length) ranges from 5 μm to 100 μm in some embodiments.

In FIG. 3C, barrier metal 105 and a conductive metal 106 are deposited to form the conductive islands 107 in the dielectric layer 104 by physical vapor deposition (PVD), CVD, and planarized by chemical-mechanical planarization (CMP), for example. The conductive metal 106 comprises Cu, Cu alloy, W, Au, Al, or any other suitable material in some embodiments. The barrier metal 105 comprises Ta, Ti, TaN, TiN, or any other suitable material in some embodiments. The barrier metal 105 prevents the conductive metal 106 diffusion into neighboring portions of the dielectric layer 104 or the substrate 102.

In FIG. 3D, a dielectric layer 108a (e.g., an IMD) is formed over the first conductive islands 107 (that include barrier metal 105 and conductive metal 106) and the dielectric layer 104 by chemical vapor deposition (CVD), for example. The dielectric layer 108a comprises $SiO_2$, low-k dielectric, SiC, TEOS, hard black diamond (HBD), SiOC, or any other suitable material with a thickness ranging from 500 Å to 5000 Å in some embodiments.

In FIG. 3E, dense via holes 109 are formed in the dielectric layer 108a by dry etching, for example. The via hole size ranges from 0.08 μm to 5 μm in some embodiments.

In FIG. 3F, a dense via array 110 is formed in the via holes 109 by PVD, CVD, and CMP, for example. Each via in the via array 110 includes a barrier metal and a conductive metal. The conductive metal comprises Cu, Cu alloy, W, Au, Al, or any other suitable material in some embodiments. The barrier metal comprises Ta, Ti, TaN, TiN, or any other suitable material in some embodiments. The barrier metal prevents the conductive metal diffusion into neighboring portions of the dielectric layer 108a.

In FIG. 3G, a dielectric layer 108b (e.g., an IMD) is formed over the first via array 110 by CVD, for example. The dielectric layer 108b comprises $SiO_2$, low-k dielectric, SiC, TEOS, hard black diamond (HBD), SiOC, or any other suitable material in some embodiments.

In FIG. 3H, trenches for conductive islands (i.e., solid metal pads) are etched out by dry etching process, and then the second conductive islands 113 that include barrier metal 111 and conductive metal 112 are formed in the dielectric layer 108b by PVD, CVD, and CMP, for example. The conductive metal 112 comprises Cu, Cu alloy, W, Au, Al, or any other suitable material in some embodiments. The barrier metal 111 comprises Ta, Ti, TaN, TiN, or any other suitable material in some embodiments. The barrier metal 111 prevents the conductive metal 112 diffusion into neighboring portions of the third dielectric layer 108b.

In FIG. 3I, a passivation layer 120 is formed by CVD, for example. The passivation layer 120 comprises SiC, TEOS, hard black diamond (HBD), SiN, or any other suitable material with a thickness ranging from 500 Å to 20000 Å in some embodiments.

In FIG. 3J, trenches 121 for bonding (or bumping) pads 122 are formed in the passivation layer 120 by dry etching, for example. The trench width (length) ranges from 5 m to 100 m in some embodiments.

Figure 3K:
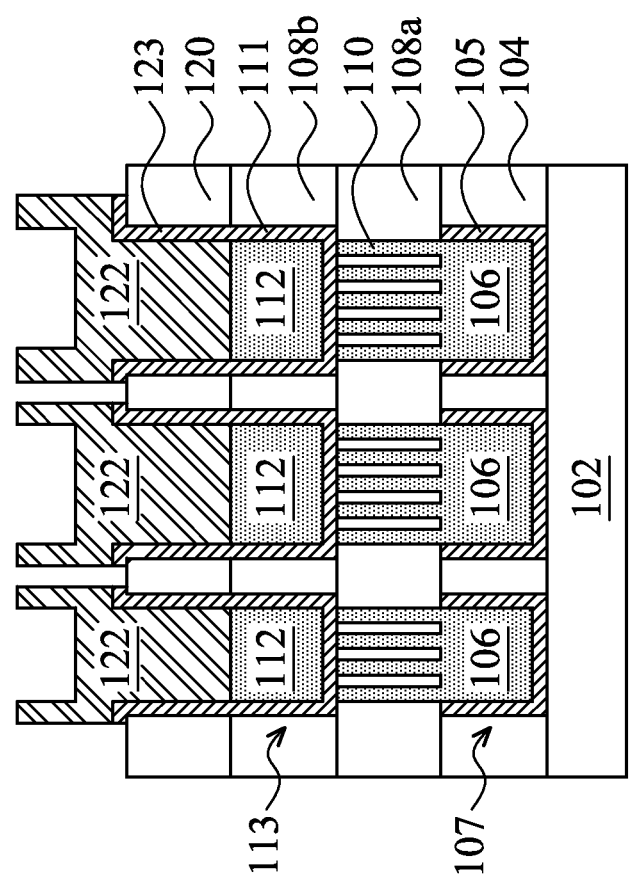

In FIG. 3K, bonding/bumping pads 122 (e.g., metal pad) that also include barrier metal 123 are formed over the conductive islands 113 (i.e., the barrier metal 111 and conductive metal 112) by PVD and dry etching, for example. The bonding/bumping pads 122 comprise AlCu or any other suitable material with a thickness from 1000 Å-20000 Å in some embodiments. The barrier metal 123 comprises TiN, TaN, or any other suitable material in some embodiments.

Figure 4:
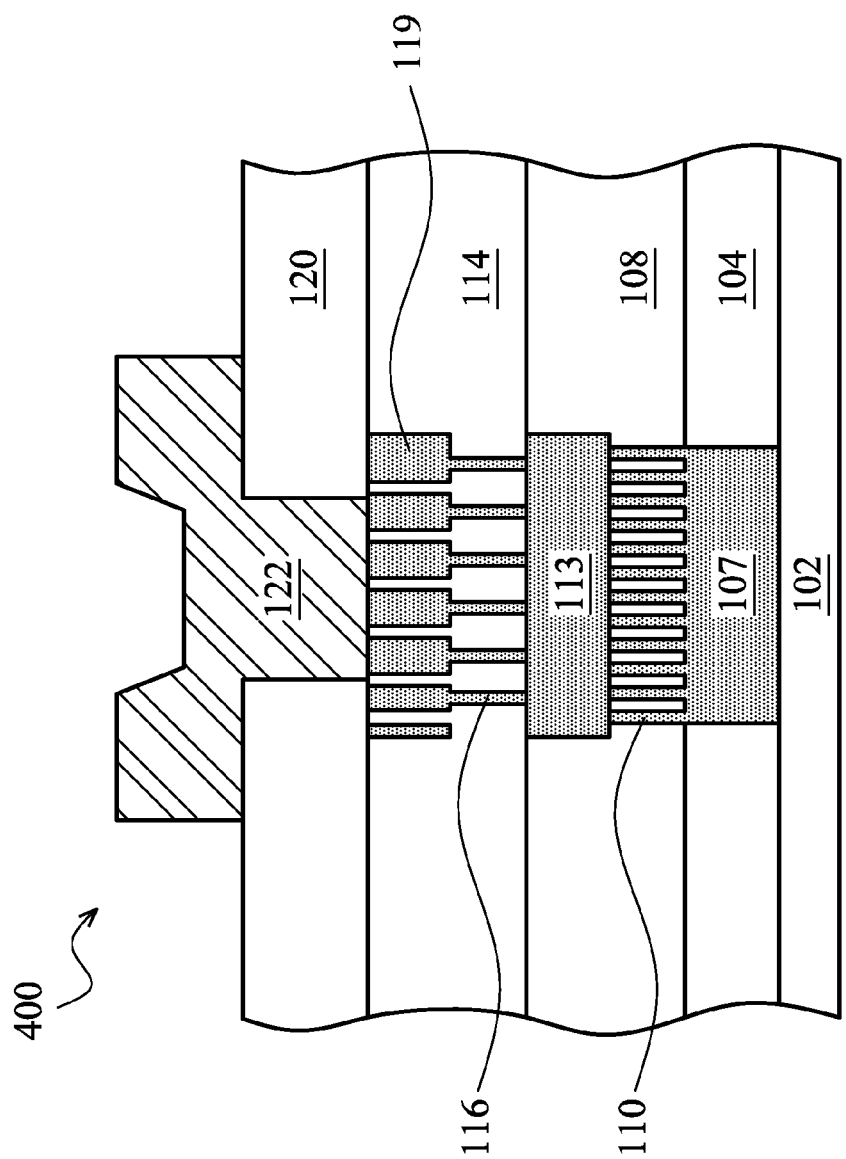
FIG. 4 is a schematic diagram of yet another exemplary bonding pad structure according to some embodiments.

FIG. 4 is a schematic diagram of yet another exemplary bonding pad structure 400 according to some embodiments. The bonding pad structure 400 is similar to the bonding pad structure 101 in FIG. 1B, except that there are multiple conductive islands 119 in FIG. 4 connected to the via array 116 in the dielectric layer 114, instead of one conductive island 118 as shown in FIG. 1B. The bonding pad structure 400 still has increased adhesion between the first and second via arrays 110 and 116, and the conductive islands 107, 113, and 119 compared to a slot structure where every via is connected to a respective metal island separately.

Figure 5:
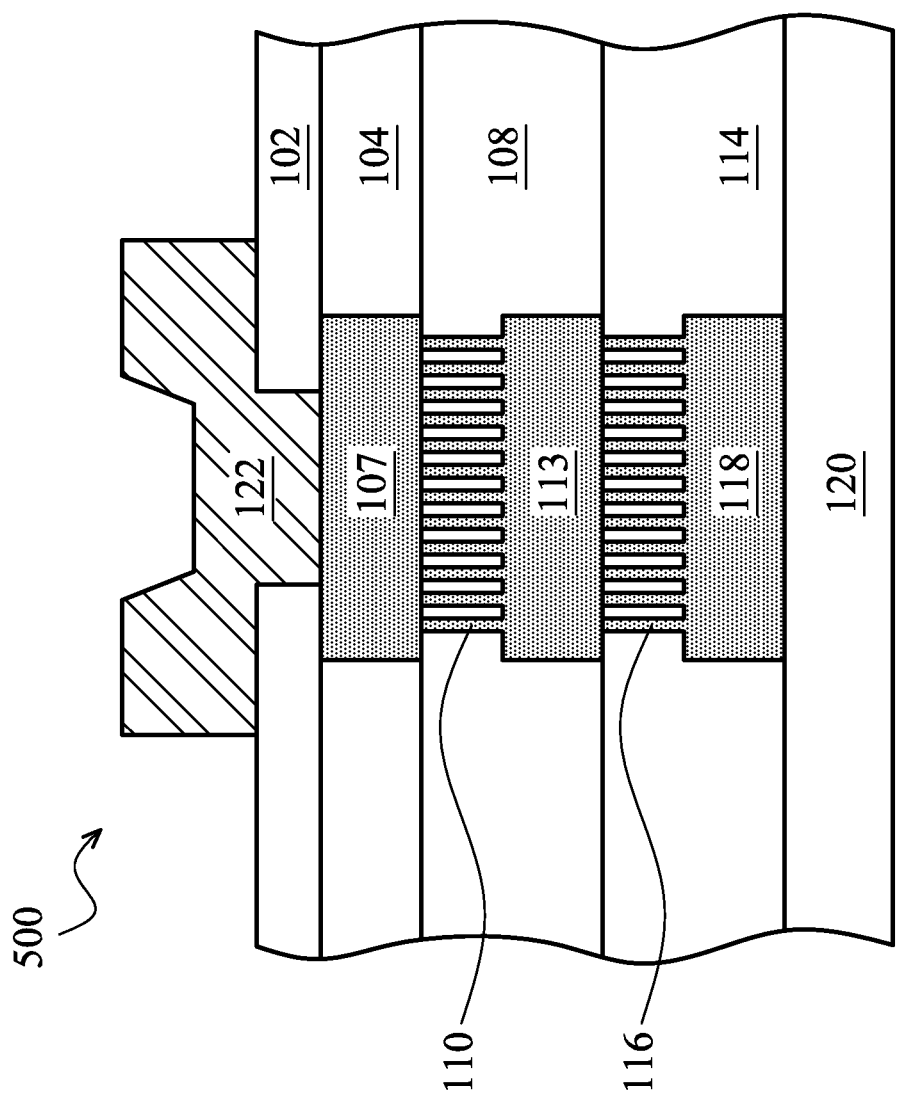
FIG. 5 is a schematic diagram of yet another exemplary bonding pad structure according to some embodiments.

FIG. 5 is a schematic diagram of yet another exemplary bonding pad structure according to some embodiments. The bonding pad structure 500 is similar to the bonding pad structure 101 in FIG. 1B, except that the bonding pad 122 is formed through the substrate 102 (upside down from FIG. 1B) instead of the passivation layer 120. The substrate 102 is a base layer comprising silicon, in some embodiments.

According to some embodiments, a bonding pad structure includes a substrate and a first conductive island formed in a first dielectric layer and disposed over the substrate. A first via array having a plurality of vias is formed in a second dielectric layer and disposed over the first conductive island. A second conductive island is formed in a third dielectric layer and disposed over the first via array. A bonding pad is disposed over the second conductive island. The first conductive island, the first via array, and the second conductive island are electrically connected to the bonding pad. The first via array is connected to no other conductive island in the first dielectric layer except the first conductive island. No other conductive island in the third dielectric layer is connected to the first via array except the second conductive island.

According to some embodiments, a method of fabricating a bonding pad structure includes forming a first conductive island in a first dielectric layer. A first via array having a plurality of vias is formed in a second dielectric layer disposed over the first conductive island. The first via array is connected to no other conductive island in the first dielectric layer except the first conductive island. A second conductive island is formed in a third dielectric layer disposed over the first via array. No other conductive island in the third dielectric layer is connected to the first via array except the second conductive island. A bonding pad is formed over the second conductive island. The first conductive island, the first via array, and the second conductive island are electrically connected to the bonding pad.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A bonding pad structure, comprising:
a substrate;
a first conductive island in a first dielectric layer over the substrate;
a first via array having a plurality of vias in a second dielectric layer over the first conductive island;
a second conductive island in a third dielectric layer over the first via array;
a second via array having a plurality of vias in a fourth dielectric layer over the second conductive island;
a plurality of third conductive islands in a fifth dielectric layer over the second via array, the third conductive islands of the plurality of third conductive islands each being separated from one another by dielectric material of the fifth dielectric layer and in contact with one via of the second via array; and
a bonding pad over the third conductive islands of the plurality of third conductive islands, the third conductive islands of the plurality of third conductive islands being in contact with the bonding pad,
wherein the first conductive island, the first via array, and the second conductive island are electrically connected to the bonding pad, the first via array is connected to no other conductive island in the first dielectric layer except the first conductive island and no other conductive island in the third dielectric layer is connected to the first via array except the second conductive island.

2. The bonding pad structure of claim 1, further comprising a passivation layer over the third dielectric layer and the bonding pad is connected to the second conductive island through the passivation layer.

3. The bonding pad structure of claim 1, wherein the second via array is connected to no other conductive island in the third dielectric layer except the second conductive island and no other conductive island in the fifth dielectric layer is connected to the second via array except the third conductive islands of the plurality of third conductive islands.

4. The bonding pad structure of claim 1, wherein the substrate comprises silicon, intermetal dielectric, or low-k dielectric.

5. The bonding pad structure of claim 1, wherein the first conductive island and the second conductive island comprise Cu, Cu alloy, W, Au, Al, TaN, Ta, Ti, or any combination thereof.

6. The bonding pad structure of claim 1, wherein the first dielectric layer, the second dielectric layer, and the third dielectric layer comprise $SiO_2$, low-k dielectric, SiC, SiN, SiOC, TEOS, or any combination thereof.

7. The bonding pad structure of claim 1, further comprising a base layer over the third dielectric layer, the bonding pad is connected to the second conductive island through the base layer, and the substrate is a passivation layer.

8. The bonding pad structure of claim 1, wherein the vias of the first via array are disposed non-uniformly over the first conductive island and a first portion of the vias of the plurality of vias of the first via array are disposed more densely than a second portion of the vias of the plurality of vias of the first via array.

9. The bonding pad structure of claim 1, wherein the first conductive island comprises a continuous surface over which the vias of the plurality of vias of the first via array are disposed, and the vias of the plurality of vias of the first via array contact the continuous surface of the first conductive island.

10. A method of fabricating a bonding pad structure, comprising:
forming a first conductive island in a first dielectric layer;
forming a first via array having a plurality of vias in a second dielectric layer over the first conductive island, wherein the first via array is connected to no other conductive island in the first dielectric layer except the first conductive island;
forming a second conductive island in a third dielectric layer over the first via array, wherein no other conductive island in the third dielectric layer is connected to the first via array except the second conductive island;

forming a second via array having a plurality of vias in a fourth dielectric layer the second conductive island;

forming a plurality of third conductive islands in a fifth dielectric layer over the second via array, the third conductive islands of the plurality of third conductive islands each being separated from one another by dielectric material of the fifth dielectric layer and in contact with one via of the second via array; and forming a bonding pad over the third conductive islands of the plurality of third conductive islands, the third conductive islands of the plurality of third conductive islands being in contact with the bonding pad, wherein the first conductive island, the first via array, and the second conductive island are electrically connected to the bonding pad.

11. The method of claim 10, further comprising forming the first dielectric layer over a substrate.

12. The method of claim 10, further forming a passivation layer over the third dielectric layer, wherein the bonding pad is connected to the second conductive island through the passivation layer.

13. The method of claim 10, wherein the second via array is connected to no other conductive island in the third dielectric layer except the second conductive island and no other conductive island in the fifth dielectric layer is connected to the second via array except the third conductive islands of the plurality of third conductive islands.

14. The method of claim 10, wherein the substrate comprises silicon, intermetal dielectric, or low-k dielectric.

15. The method of claim 10, wherein the first conductive island and the second conductive island comprise Cu, Cu alloy, W, Au, Al, TaN, Ta, Ti, or any combination thereof.

16. The method of claim 10, wherein the first dielectric layer, the second dielectric layer, and the third dielectric layer comprise $SiO_2$, low-k dielectric, SiC, SiN, SiOC, TEOS, or any combination thereof.

17. The method of claim 10, wherein the vias of the first via array are disposed non-uniformly over the first conductive island and a first portion of the vias of the plurality of vias of the first via array are disposed more densely than a second portion of the vias of the plurality of vias of the first via array.

18. A bonding pad structure, comprising:

a substrate;

at least one level over the substrate, each level including:
    a first conductive island in a first dielectric layer;
    a via array having a plurality of vias in a second dielectric layer over the first conductive island;

a second conductive island in a third dielectric layer over the at least one level, a second via array having a plurality of vias in a fourth dielectric layer over the second conductive island;

a plurality of third conductive islands formed in a fifth dielectric layer over the second via array, the third conductive islands of the plurality of third conductive islands each being separated from one another by dielectric material of the fifth dielectric layer and in contact with one via of the second via array; and a bonding pad over the third conductive islands of the plurality of third conductive islands, the third conductive islands of the plurality of third conductive islands being in contact with the bonding pad, wherein the first conductive island of each level and the via array of each level are electrically connected to the bonding pad, the via array of each level is connected to no other conductive island in the first dielectric layer of each level except the first conductive island.

19. The bonding pad structure of claim 18, further comprising a passivation layer over the third dielectric layer and the bonding pad is connected to the top conductive island through the passivation layer.

20. The bonding pad structure of claim 18, wherein the vias of the first via array are disposed non-uniformly over the first conductive island and a first portion of the vias of the plurality of vias of the first via array are disposed more densely than a second portion of the vias of the plurality of vias of the first via array.

* * * * *